United States Patent
Mills et al.

(10) Patent No.: US 9,287,648 B2
(45) Date of Patent: Mar. 15, 2016

(54) CONTACT ELEMENT, IN PARTICULAR A SOLDER TAB AND PHOTOVOLTAIC JUNCTION BOX WITH CONTACT ELEMENT, IN PARTICULAR A SOLDER TAB

(75) Inventors: Brian Wade Mills, Santa Rosa, CA (US); Lee Michael Wade, Windsor, CA (US); Dustin Delmar Reede Carver, Windsor, CA (US); Ian McKay Pratt, Ukiah, CA (US)

(73) Assignee: Multi-Holding AG, Allschwil (CH)

(*) Notice: Subject to any disclaimer, the term of this patent is extended or adjusted under 35 U.S.C. 154(b) by 145 days.

(21) Appl. No.: 13/885,041

(22) PCT Filed: Dec. 9, 2011

(86) PCT No.: PCT/EP2011/072321
§ 371 (c)(1),
(2), (4) Date: May 13, 2013

(87) PCT Pub. No.: WO2012/076693
PCT Pub. Date: Jun. 14, 2012

(65) Prior Publication Data
US 2013/0264699 A1    Oct. 10, 2013

Related U.S. Application Data

(60) Provisional application No. 61/421,367, filed on Dec. 9, 2010.

(30) Foreign Application Priority Data

Mar. 28, 2011    (EP) .................................... 11159992

(51) Int. Cl.
*H01L 23/48* (2006.01)
*H01L 23/488* (2006.01)
*H01R 13/24* (2006.01)
*H01R 4/02* (2006.01)

(Continued)

(52) U.S. Cl.
CPC ...... *H01R 13/2407* (2013.01); *H01L 23/49838* (2013.01); *H01R 4/02* (2013.01);
(Continued)

(58) Field of Classification Search
CPC ............. H01L 23/49838; H01R 11/05; H01R 13/2407; H01R 43/20; H01R 43/205; H01R 43/22; H01R 4/02
USPC .......................... 257/696; 439/884; 228/180.1
See application file for complete search history.

(56) References Cited

U.S. PATENT DOCUMENTS 3,638,172 A    1/1972    Adam
4,873,615 A *  10/1989   Grabbe ........................ 361/742
(Continued)

FOREIGN PATENT DOCUMENTS

WO    2009/062326 A2    5/2009

OTHER PUBLICATIONS

International Search Report of PCT/EP2011/072321 dated Feb. 23, 2012.

*Primary Examiner* — Andy Huynh
*Assistant Examiner* — Sitaramarao S Yechuri
(74) *Attorney, Agent, or Firm* — Sughrue Mion, PLLC (57) ABSTRACT

A contact element (1) for providing an electrical contact between a first electrical device (7) and a second electrical device, wherein the contact element (1) comprises a first contact portion (2) to be electrically connected to the first electrical device (7) and a second contact portion (4) to be connected to the second electrical device. The first contact portion (2) is arranged at a distance (D) to the second contact portion (4), whereby the contact element (1) comprises further an adjustment portion (3) connecting said first and second contact portion (2, 4), wherein with said adjustment portion (3) said distance (D) between the first contact portion (2) and the second contact portion (4) is adjustable.

13 Claims, 5 Drawing Sheets

(51) Int. Cl.
*H01R 11/05* (2006.01)
*H01R 43/20* (2006.01)
*H01L 23/498* (2006.01)
*H02S 40/34* (2014.01)
*H01R 43/22* (2006.01)

(52) U.S. Cl.
CPC ............... *H01R 11/05* (2013.01); *H01R 43/20* (2013.01); *H01R 43/205* (2013.01); *H02S 40/34* (2014.12); *H01L 2924/0002* (2013.01); *H01R 43/22* (2013.01); *Y10T 29/49174* (2015.01)

(56) References Cited

U.S. PATENT DOCUMENTS

| | | | | |
|---|---|---|---|---|
| 5,119,547 | A * | 6/1992 | Ii | 29/764 |
| 6,031,730 | A | 2/2000 | Kroske | |
| 6,817,091 | B2 * | 11/2004 | Fitzgerald et al. | 29/840 |
| 7,632,718 | B2 * | 12/2009 | Hosseini | 438/123 |
| 2006/0038265 | A1 * | 2/2006 | Oberlin et al. | 257/676 |
| 2006/0270286 | A1 | 11/2006 | Zhao et al. | |
| 2010/0173511 | A1 * | 7/2010 | Giefers | 439/329 |

* cited by examiner

CONTACT ELEMENT, IN PARTICULAR A SOLDER TAB AND PHOTOVOLTAIC JUNCTION BOX WITH CONTACT ELEMENT, IN PARTICULAR A SOLDER TAB

TECHNICAL FIELD

The present invention relates to a contact element, in particular a solder tab, and to a photovoltaic junction box with a contact element, in particular a solder tab.

PRIOR ART

Photovoltaic junction boxes are well known from prior art. Usually said junction boxes provide an electrical contact between contacts of a photovoltaic solar panel and cables which are connected to a further photovoltaic solar panel or to any other device, such as a distribution box or a bus system.

WO 2009/062326 for example discloses such a junction box. Although with such a junction box very good results concerning mounting the same onto the solar panel can be achieved it is still a need of the manufacturer to provide a solution to mount such junction boxes in a shorter period of time.

In particular it has been recognized that the process of connecting the solder tab to the respective elements of the solar panel is crucial.

SUMMARY OF THE INVENTION

It is therefore an object of the present invention to provide a contact element, in particular a solder tab or a solder element, which improves the mounting procedure of a junction box to a photovoltaic solar panel.

Such an object is solved by a contact element, in particular a solder tail or solder tab or solder element, according to claim 1. Accordingly the invention refers to a contact element for providing an electrical contact between a first electrical device, for example a terminal or connector in a junction box of a photovoltaic panel, and a second electrical device, for example the electrical contacts of the solar panel. The contact element comprises a first contact portion to be electrically connected to the first electrical device and a second contact portion to be connected to the second electrical device, wherein the first contact portion is arranged at a distance to the second contact portion. The contact element comprises further an adjustment portion connecting said first and second contact portion, wherein with said adjustment portion said distance between the first contact portion and the second contact portion is adjustable. During this adjustment the adjustment portion will be deformed, preferably in a resilient or permanent manner.

Preferably the adjustment portion is provided such that it is deformed with a rolling motion and/or a bending motion upon adjusting said distance.

Preferably the contact element is a solder tab which is soldered to the first electrical device and the second electrical device. It would be also possible that the solder tab or contact element is welded to one of the electrical devices and soldered to the other one of the electrical devices.

The adjustment portion comprises preferably at least one, preferably at least two, preferably a plurality of web elements which connect said first contact portion with said second contact portion.

The adjustment portion comprises at least one cut-out which is arranged such that the remaining elements of the adjustment portion provide said web elements.

Said cut-out comprises preferably an edge which is arranged such that via said edge a force is exertable or applicable onto the second contact portion such that the distance is adjustable with a stationary first contact portion.

Preferably the first contact portion extends in a first plane and the second contact portion extends in a second plane which extends parallel to the first plane, wherein said distance is defined as being perpendicular to said planes.

The adjustment portion comprises preferably a first section which adjoins the first contact portion and extends substantially perpendicular to said first contact portion, a second section adjoining said first section and a third section which adjoins said second section and said second contact portion, wherein the third section is substantially perpendicular to said second contact portion.

Preferably said first section and said third section extend parallel to each other and the second section comprises a curved structure around an axis that is substantially parallel to the said first plane and said second plane.

Preferably the curved second section has a cross-sectional shape of a semi circle.

Preferably said cut-out extends substantially fully over said second section and partly into said first section and/or partly into said third section. Alternatively said cut-out extends only partly over said second section.

Method to mount a contact element or a solder tab or solder element as mentioned, wherein said contact element is electrically connected with said first contact portion to a first electrical device, such as for example a contact element of a photovoltaic junction box, an adjustment force is applied onto the contact element, such that the adjustment portion is deformed and said second contact portion will be moved relative to said first contact portion in order to adjust the distance between the first contact portion and the second contact portion, and said contact element is electrically connected with said second contact portion to a second electrical device, such as for example a contact device of a solar panel.

Preferably a tool is moved perpendicular to the first plane such that the second contact portion will be moved perpendicular to the first contact portion.

Preferably said tool comprises a slot in which a contact surface is arranged, whereby said contact surface contacts the contact element or the solder element during the adjustment step.

Further embodiments of the invention are laid down in the dependent claims.

BRIEF DESCRIPTION OF THE DRAWINGS

Preferred embodiments of the invention are described in the following with reference to the drawings, which are for the purpose of illustrating the present preferred embodiments of the invention and not for the purpose of limiting the same. In the drawings, FIG. 1 a perspective view of a contact element, in particular a solder element, to provide an electrical contact between two electrical elements or devices.

DESCRIPTION OF PREFERRED EMBODIMENTS

Figure 1:
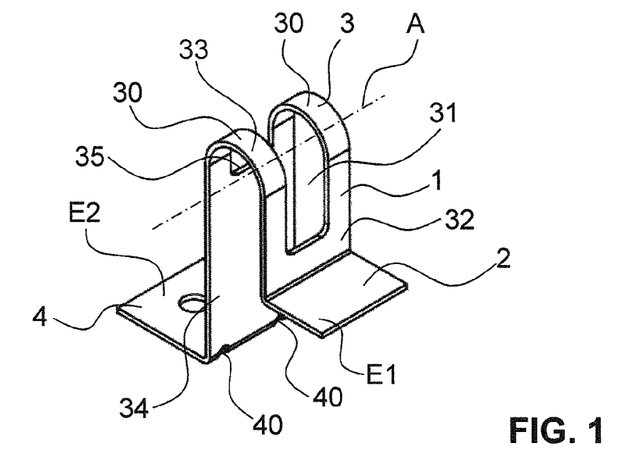
Figure 8:
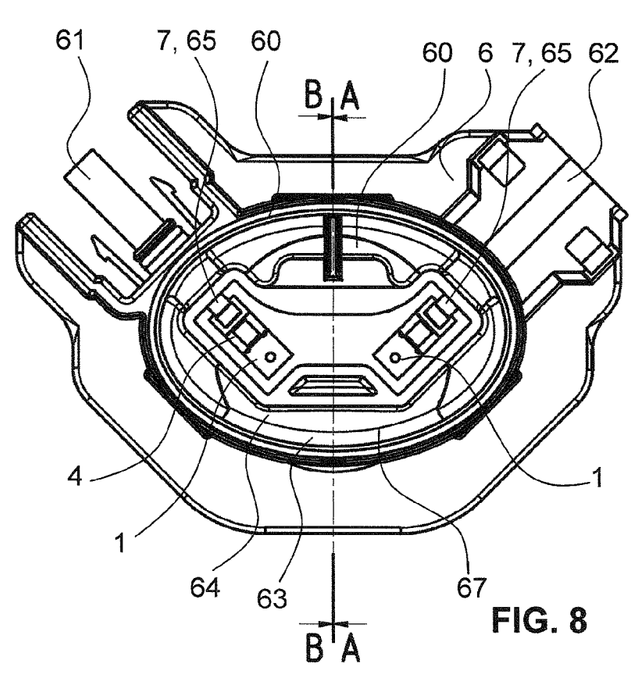
FIG. 8 shows a photovoltaic junction box in which the contact element according to the invention is arranged.
Figure 9:
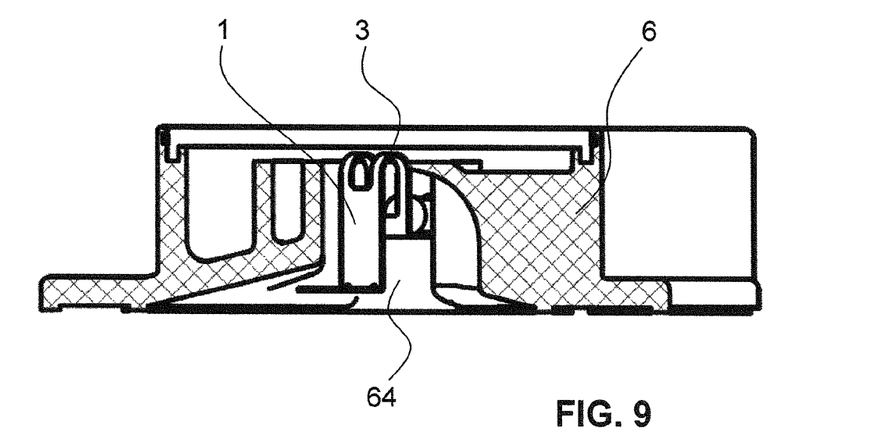
FIG. 9 shows a cross-sectional view of the junction box according to FIG. 8 with the contact tab before manipulation.
Figure 10:
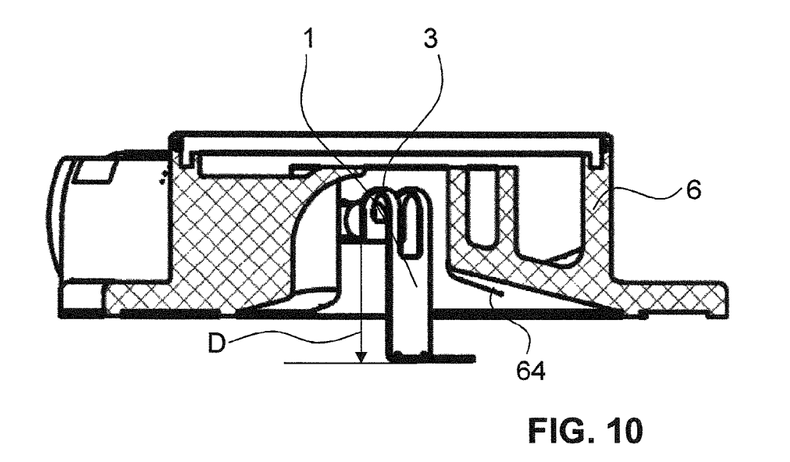
FIG. 10 shows the cross-sectional view of the junction box of FIG. 9 after manipulation.

FIG. 1 shows a perspective view of a contact element 1, in particular a solder element 1, to provide an electrical contact between two electrical devices, namely between a first electrical device and a second electrical device. The contact element is designated mostly as solder element hereinafter, but the term solder element includes but is not limited to a contact element as well as a solder element or a welding element. Preferably such a contact element 1 is used in a photovoltaic junction box as it is shown in FIGS. 8 to 10 to provide an electrical contact between the electrical elements or devices of the photovoltaic solar panel and an electrical terminal or connector that is connected to a cable. The second electrical device can therefore be a conductive path of the photovoltaic solar panel and the first electrical device can be a part of an electrical connector in a photovoltaic junction box.

The contact element or solder element 1 comprises a first contact portion 2 and a second contact portion 4 which are linked by an adjustment portion 3 that is arranged between the first contact portion. The first contact portion 2 is provided to be electrically connected to the first electrical device and the second contact portion is provided to be connected to the second electrical device. Thereby an electrical contact is established between the first electrical device and the second electrical device by means of the solder element 1, namely via the first contact portion 2, the adjustment portion 3 and the second contact portion 4. Preferably the contact portion 2, 4 are welded or soldered to respective electrical device. Alternatively a mechanical connection such as a clamping or crimping connection is also possible.

Figure 2:
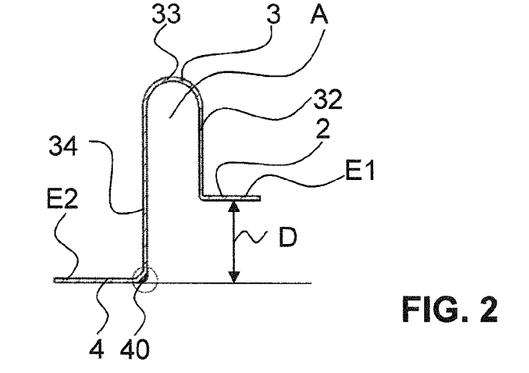
FIG. 2 shows a cross-sectional view of the contact element of FIG. 1.

The first contact portion 2 is arranged at a distance D to the second portion 4 as it is shown in FIG. 2. This distance D can be varied by means of the adjustment portion 3 in order to use the contact element 1 with different types of photovoltaic junction boxes and panels as well as to compensate tolerances. In other words: The distance D between the first contact portion 2 and the second contact portion 4 is adjustable or changeable, respectively by means of the adjustment portion 3. Thereby the first contact portion 2 will be connected to the first electrical device and afterwards, during the process of mounting the photovoltaic junction box onto a photovoltaic panel, the second contact portion 4 will be moved towards the second electrical device, whereby the distance D will be varied or adjusted. Once the second contact portion 4 contacts the second electrical device the contact portion 4 will be electrically connected to the second electrical device.

The first contact portion 2 as well as the second contact portion 4 have the shape preferably of a rectangular plane, whereas the first contact portion 2 extends in a first plane E1 and the second contact portion 4 extends in a second plane E2. Thereby the first contact portion 2 and the second contact portion 4 extend substantially parallel to each other which means that the first plane E1 is parallel to the second plane E2. The perpendicular distance between the planes E1 and E2 is defined as the distance D. Therefore the distance D will be varied by moving the second contact portion 4 with respect to the first contact portion 2. Preferably the contact portion 2 and 4 will not be deformed during this adjustment which means that the portion 2 and 4 remain in the respective plane E1, E2 although the distance between the planes E1, E2 will be changed.

In order to adjust said distance D the adjustment portion 3 will be deformed. Preferably the adjustment portion 3 will be augmented or deformed by means of a deliberate plastic deformation such that a permanent deformation as well as a change in geometry occurs.

Preferably the adjustment portion 3 is provided such that a rolling motion and/or bending motion is/are executed upon adjusting said distance D. As viewed from the side or in the cross-sectional view as shown in FIG. 2 the adjustment portion 3 has the shape of a semi-circle. Assuming that the first contact portion 2 is already attached to the first contact element the second contact portion 3 will be moved perpendicular to the fixed first contact portion 2. Thereby the adjustment portion 3 will be deformed by means of a rolling motion and partly also with a bending motion. For that reason a tool 5 will be used to exert a force onto the solder element 1 so that said second contact portion 4 moves relative to the first contact portion 2 such that the distance D will be changed. This will be further explained below with regards to FIGS. 4 to 7.

The adjustment portion 3 comprises mainly a first section 32, a second section 33 and a third section 34. The first section 32 adjoins the first contact portion 2 and extends or protrudes substantially perpendicular to said first contact portion 2. The second section 33 adjoins said first section 32 and connects the first section 32 to the third section 34. The second section 33 will be deformed during adjusting the distance D. The third section 34 adjoins said second section 33 and said second contact portion 4, wherein the third section 34 is substantially perpendicular to said second contact portion 4.

With regard to the first plane E1 the first section 32 extends substantially perpendicular to the first plane E1. In the present embodiment from the upper side of E1. The second section 33 changes the direction of the orientation with regard to the first plane E1 and extends from the upper side of E1 through the first plane to the lower side of the first plane E1. As seen from the second plane E2 the second section 33 towards the first plane E1 and crosses the same as just mentioned.

Figure 3:
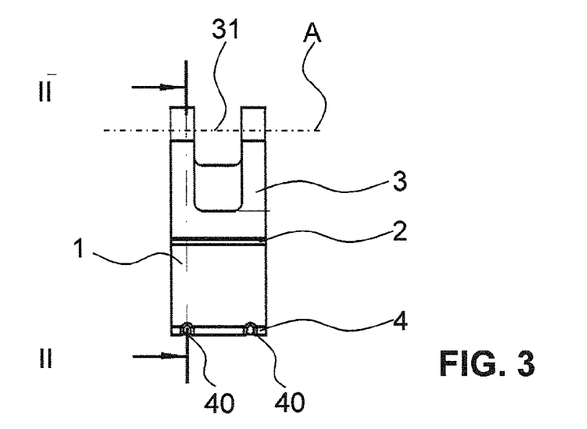
FIG. 3 shows a back view according to the contact element of FIG. 1.

The second section 33 has as viewed in the cross-sectional view of FIG. 3 a curved shape, preferably the shape of a semi-circle. Thereby the semi-circle extends around a middle axis A which is parallel to said planes E1 and E2.

The adjustment portion 3 in the present embodiment is preferably provided with two web elements 30. Said web elements 30 are thereby arranged such that they extend preferably fully over the second section 33, whereas a structure is provided that can be deformed in an advantageous manner. In the present embodiment the web elements 30 are provided by means of a cut-out 31 which extends substantially over the whole length of the second section 33 as well as partly into the first section 32 and the third section 32. In the region towards the second contact portion 4 the cut-out is limited by means of an edge 35 upon which a force F can be exerted in order to provide the movement of the second contact portion 4.

It is also possible to arrange at least one, preferably at least two, even more preferably more than two web elements 30. The arrangement of such web elements 30 have the advantage that said rolling and/or bending motion can be executed in a very easy and controlled manner since only little forces have to be applied.

The arrangement of the web elements 30 is advantageous also in view of the thermal expansion during the use of the solar panel.

In the area of transition between the adjustment portion 3 and the second contact portion 4 at least one reinforcement seam 40 is arranged in order to maintain the rectangular arrangement for the adjustment portion 3 and the second contact portion 4. In the present embodiment two reinforcement seams 40 are arranged.

The solder element 1 is made out of an electrically conductive material such as a metallic alloy.

Figure 4A:
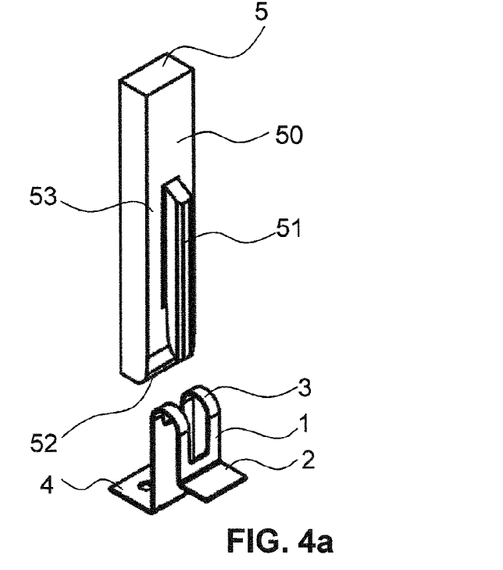
FIG. 4a, 4b show a perspective view and a side view of a tool to mount a contact element according to FIG. 1 in a first position.
Figure 4B:
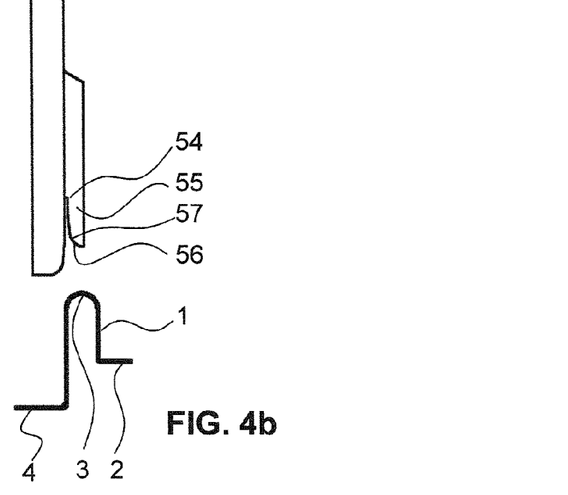

FIGS. 4a and 4b show a perspective view and a sideview of the solder element 1 together with a respective tool 5 to manipulate the adjustment portion 3 to adjust the distance between first contact portion 2 and the second contact portion 4. The tool 5 comprises a main body 50 from which a manipulation section 51 extends. The main body 50 is provided as rectangular block having a rounded edge 52 which faces the adjustment portion 3 during manipulation. The manipulation section 51 extends from the surface 53 facing the adjustment portion 3. The manipulation section 51 comprises a finger 55 which extends from the surface 53 and which provides a slot 56 between the finger 55 and the surface 53. The slot ends with a contact surface 54 provided by said finger 55. The contact surface 54 is arranged such that it comes into contact with the edge 35 of the cut out 31 of the solder element 1.

The finger comprises optionally also a rounded edge 57 which enables an easy insertion of the respective part of the adjustment portion 3. Furthermore the width of the slot 56 is provided such that its clearance decreases towards the slot 56 which enhances the insertion process further.

Figure 5A:
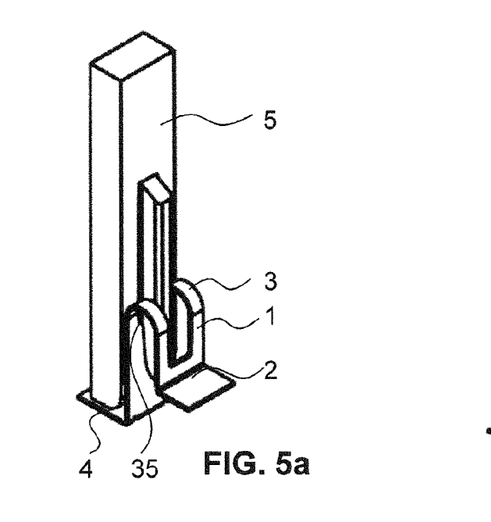
FIG. 5a, 5b show a perspective view and a side view of a tool to manipulate or to mount a contact element according to FIG. 1 in a second position.
Figure 5B:
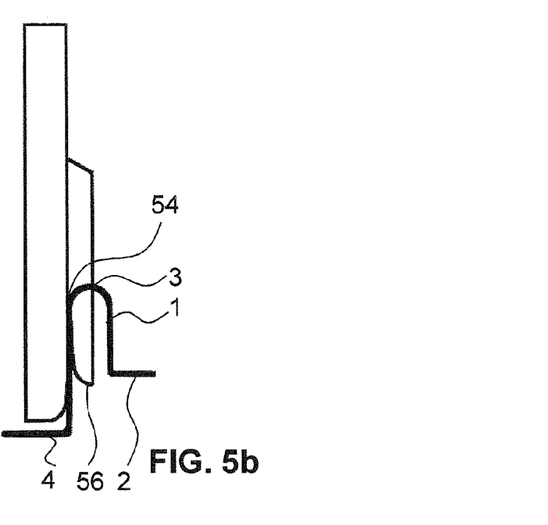

In FIGS. 5a and 5b it is shown that the third section 34 of the adjustment portion 3 extends into the slot 56 and that the edge 35 is in contact with the contact surface 54. The contact surface 54 provides a force onto the edge 35 in order to manipulate the adjustment portion 3. As it can be seen there is no contact between the second contact portion 4 and the tool 5.

Figure 6:
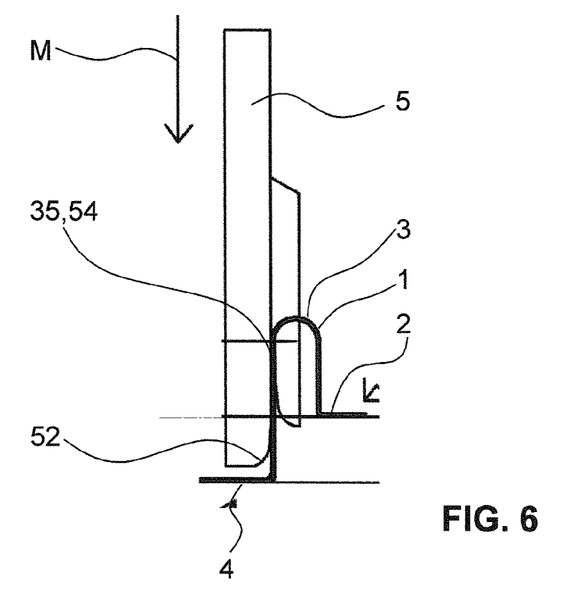
FIGS. 6 to 7 show side views of the tool to manipulate a contact element.
Figure 7:
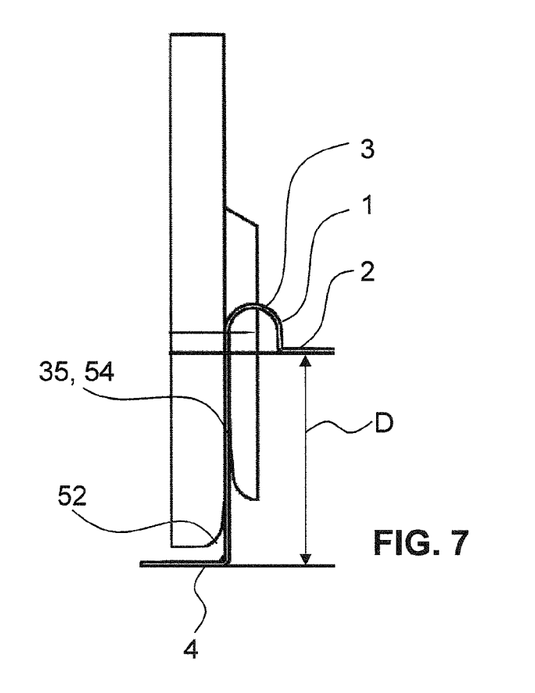

FIGS. 6 and 7 show the process of manipulating the adjustment section 3. In a first step the tool 5 is moved along arrow M towards the edge 35 and comes into contact by means of the contact surface 54. This is shown in FIGS. 6 and 7. Afterwards the tool 5 will be moved further in direction of arrow M and manipulates the adjustment section 3 accordingly until the desired distance D is reached, during which the section 30 roll-forms along the surface of main body 50 controlling its deformation.

FIG. 8 shows a photovoltaic junction box 6 for a solar panel. The junction box 6 comprising a housing 60, a first coupling element 61 and a second coupling element 62. The housing 6 comprises sidewalls 63 defining an interior space 64. The first coupling element comprises a first contact element 65 and the second coupling 62 comprises also a first contact element 65, which contact elements 65 penetrate at least one of the sidewalls 63, so that the contact elements 65 provide an electrical contact from external contact elements to internal contact elements, such as solder elements 1. The first contact element 65 can also be designated as first electrical device 7. The interior space 64 is accessible by means of an opening 67 which allows the tool 5 to be introduced into the interior space 64 in order to manipulate the solder element 1 as described above.

A first solder element 1 or contact element 1 here is soldered or welded to the first electrical contact element or electrical device 65 arranged in the first coupling element 61 and will be soldered or welded to the respective elements on the solar panel. Said first electrical contact element 65 is therefore said first electrical device and said solar panel is considered as second electrical device. A second solder element 1 is soldered or welded to the first contact element 65 arranged in the second coupling element 62 and is soldered or welded to the respective elements on the solder panel.

FIG. 9 shows a cross-sectional view along line A-A in FIG. 8. The solder element 1 is here shown before manipulation. Thereby the first contact portion 2 is soldered or welded to the contact element 65 and the second contact portion remains in the interior space 64.

FIG. 10 shows the cross-sectional view along line B-B in FIG. 8. The solder element 1 here is shown after manipulation. Thereby the first contact portion 2 is soldered or welded to the contact element 65 and the second contact portion extends from the interior space 64 which means that the distance D has been adjusted by deforming the adjustment portion 3.

LIST OF REFERENCE SIGNS

| | |
|---|---|
| 1 | contact element, solder element |
| 2 | first contact portion |
| 3 | adjustment portion |
| 4 | second contact portion |
| 5 | tool |
| 6 | junction box |
| 7 | first electrical device |
| 30 | web elements |
| 31 | cut-out |
| 32 | first section |
| 33 | second section |
| 34 | third section |
| 35 | edge |
| 40 | reinforcement seam |
| 50 | main body |
| 51 | manipulation section |
| 52 | rounded edge |
| 53 | surface |
| 54 | contact surface |
| 55 | finger |
| 56 | slot |
| 60 | housing |
| 61 | first coupling element |
| 62 | second coupling element |
| 63 | sidewalls |
| 64 | interior space |
| 65 | first contact element |
| A | Middle Axis |
| M | Manipulation direction |
| D | Distance |
| E1 | first plane |
| E2 | second plane |

The invention claimed is:

1. A method to mount a contact element for providing an electrical contact between a first electrical device and a second electrical device, wherein the contact element comprises
   a first contact portion to be electrically connected to the first electrical device;
   a second contact portion to be electrically connected to the second electrical device, wherein the first contact portion is arranged at a distance to the second contact portion; and
   an adjustment portion connecting said first and second contact portion, wherein with said adjustment portion said distance between the first contact portion and the second contact portion is adjustable,
   wherein the adjustment portion comprises at least one cut-out which is arranged such that the remaining elements of the adjustment portion provide web elements and
   wherein said cut-out comprises an edge which is arranged such that via said edge an adjustment force is exertable onto the second contact portion such that said distance is adjustable with regard to the first contact portion which is stationary;

wherein said contact element is electrically connected with said first contact portion to a first electrical device, wherein afterwards an adjustment force is applied onto said edge of the contact element, such that the adjustment portion is deformed and said second contact portion will be moved relative to said first contact portion in order to adjust the distance between the first contact portion and the second contact portion, and wherein afterwards said contact element is electrically connected with said second contact portion to the second electrical device.

2. The method according to claim 1, wherein the adjustment portion is provided such that it is deformed with a rolling motion and/or a bending motion upon adjusting said distance.

3. The method according to claim 1, wherein the adjustment portion comprises a plurality of web elements which connect said first contact portion with said second contact portion.

4. The method according to claim 1, wherein the first contact portion extends in a first plane and the second contact portion extends in a second plane which extends parallel to the first plane, wherein said distance is defined as being perpendicular to said planes.

5. The method according to claim 4, wherein a tool is moved perpendicular to the first plane such that the second contact portion will be moved perpendicular to the first contact portion.

6. The method according to claim 4, wherein the tool comprises a slot in which a contact surface is arranged, whereby said contact surface contacts the contact element during the adjustment step.

7. The method according to claim 4, wherein the adjustment portion comprises
 a first section which adjoins the first contact portion and extends substantially perpendicular to said first contact portion,
 a second section adjoining said first section and
 a third section which adjoins said second section and said second contact portion, wherein the third section is substantially perpendicular to said second contact portion.

8. The method according to claim 7, wherein said first section and said third section extend parallel to each other and wherein the second section comprises a curved structure around an axis that is substantially parallel to the said first plane and said second plane.

9. The method according to claim 8, wherein the curved structure has a cross-sectional structure of a semicircle.

10. The method according to claim 7, wherein said cut-out extends substantially fully over said second section and partly into said first section and/or partly into said third section, or wherein said cut-out extends only partly over said second section.

11. The method according to claim 1, wherein the electrical connection to said first and said second electrical device is established by means of a soldered or welded connection.

12. The method according to claim 1, wherein said contact element is a solder element.

13. The method according to claim 1, wherein a tool engages with said edge in order to exert said adjustment force.

* * * * *